United States Patent
Feldtkeller

[11] 3,980,949
[45] Sept. 14, 1976

[54] MAGNETO-OPTICAL MEASURING TRANSDUCER FOR VERY HIGH CURRENTS/VOLTAGES

[75] Inventor: Ernst Feldtkeller, Munich, Germany

[73] Assignee: Siemens Aktiengesellschaft, Berlin & Munich, Germany

[22] Filed: Sept. 13, 1974

[21] Appl. No.: 505,674

[30] Foreign Application Priority Data
Sept. 17, 1973 Germany............................ 2346722

[52] U.S. Cl.................................... 324/96; 350/151
[51] Int. Cl.²...................... G01R 19/00; G02F 1/09
[58] Field of Search ............................... 324/96–97; 350/151; 333/24.3

[56] References Cited
UNITED STATES PATENTS

| | | | |
|---|---|---|---|
| 3,590,374 | 6/1971 | Evans et al. ........................ | 324/96 |
| 3,707,321 | 12/1972 | Jaecklin ............................... | 324/96 |
| 3,784,281 | 1/1974 | Kuse ................................... | 350/151 |

OTHER PUBLICATIONS

Braginski et al., "Domain Structure & Stress in Epitaxial YIG Films", IEEE Trans. on Magnetics, 9–1972, pp. 300–303.

Archer et al., "Magnetically Tunable Microwave Bandstop Filters Using Epitaxial YIG Film Resonators," Jr. of Applied Phys., vol. 41, 3–1970, pp. 1359–1360.

Ito et al., "LPE Films of Bismuth–Substituted Bubble Garnet," IEEE Trans. on Magnetics, 9–1973, pp. 460–463.

*Primary Examiner*—John K. Corbin
*Assistant Examiner*—Wm. H. Punter
*Attorney, Agent, or Firm*—Hill, Gross, Simpson, Van Santen, Steadman, Chiara & Simpson

[57] ABSTRACT

A magneto-optical measuring transducer for use as a Faraday rotator in a device to measure high currents/voltages in response to a magnetic field created by the current to be measured by rotating the direction of polarization of a beam of polarized light characterized by the transducer having a first magnetically saturable part and a second part which has a paramagnetic behavior. The first part preferably consists of yttrium-iron-garnet layer and the second part of a gadolinium-gallium-garnet plate.

5 Claims, 2 Drawing Figures

MAGNETO-OPTICAL MEASURING TRANSDUCER FOR VERY HIGH CURRENTS/VOLTAGES

BACKGROUND OF THE INVENTION

The present invention is directed to a magneto-optical measuring transducer which is utilizing in measuring high currents at high voltages by rotating the direction of polarization of a polarized beam in response to a magnetic field created by the current to be measured.

Magneto-optical measuring transducers are known. An example of a known transducer is disclosed in German Auslegungsschrift 1,283,363. In this reference, polarized light is passed through a Faraday rotator which is arranged in a magnetic field whose strength is dependent upon the current to be measured. The direction of polarization of the polarized light will be rotated with the amount of rotation being dependent upon the magnetic field so that the polarized light emerging from the rotator has its polarization direction altered. After emerging from the rotator the light is passed through a second Faraday rotator which is at earth potential. An auxiliary circuit imparts a controllable magnetic field to the second rotator to rotate the direction of polarization of the beam back to the original polarization direction. The strength of the auziliary current which is used to create the controllable magnetic field is thus a gauge for the strength of the current which is being measured by the first rotator.

Measuring transducers of this type can exhibit a relatively high degree of accuracy of measurement in the range of the normal or nominal currents, i.e. the current strengths for which the system is designed. However, in the case of an overload, excessive currents can occur at such a magnitude that they do not fall within the measurement range of one transducer. In order to measure the magnitude of these excessively high currents, it has been necessary to provide a second measuring transducer and consequently it was necessary to accept a very high construction cost for producing a measurement device.

SUMMARY OF THE INVENTION

The present invention provides a magneto-optical transducer which is capable for use as a Faraday rotator for changing the direction of polarization of a polarized beam of light in response to a magnetic field produced by the current to be measured which rotator is capable of carrying out measurements both in the range of nominal currents and in the range of excessive high currents. To accomplish this, the magneto-optical transducer is composed of two parts with a first part being of a magnetically saturable part and the second part which has a diamagnetic or paramagnetic behavior with the polarized light transversing both parts. Preferably, the first part is a yttrium-iron-garnet layer and the second part is a gadolinium-gallium-garnet plate. The transducer is preferably constructed so that the magnetic field of the given nominal current corresponds to half of the magnetic saturation field strength for the first part. In one embodiment, at least one of the parts is provided with a mirror surface so that the polarized light which passes through the transducer is reflected back therethrough to make at least two passes.

DESCRIPTION OF THE PREFERRED EMBODIMENT

Figure 1:
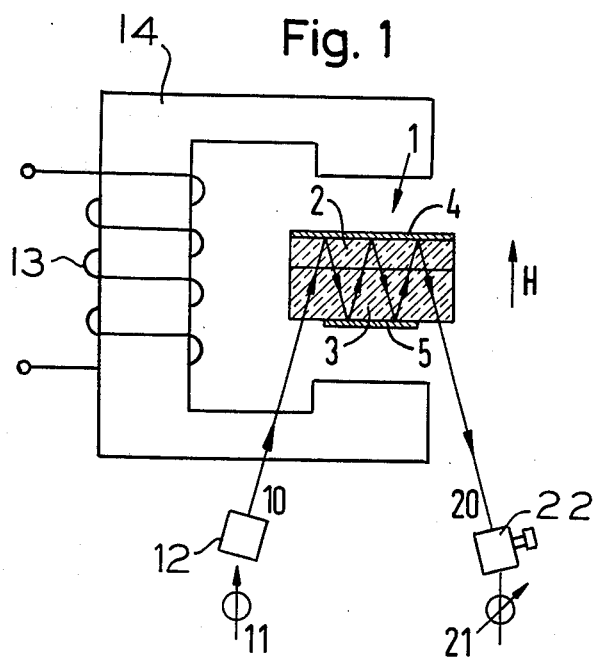
FIG. 1 is a diagrammatic presentation with portions in cross section of the magneto-optical transducer of the present invention.

The principles of the present invention utilize the concept that the direction of polarization of a beam traversing a body located in a magnetic field will be rotated in direct dependence upon the strength of the field. However, when a current reaches a given magnitude, the flux created in the magnitude field will saturate the body and no further Faraday rotation will occur with an increase in magnetic flux due to an increase in the current.

The magneto-optical body 1 of the present invention is a compound body which includes a first part or layer 2 which has a high sensitivity to the flux strength and a second part or plate 3 which has a lower sensitivity. The part 2 may be a yttrium-iron-garnet layer having a thickness in the order of 10 $\mu$m and the second part 3 may be a gadolinium-gallium-garnet plate having a thickness of approximately 1mm. An outer surface of a layer 2 is provided with a reflecive material to form a mirror surface 4 and a portion of the area of an outer surface of the plate 3 is provided with a mirror reflector surface 5. Thus, when a beam 10 of polarized light having a direction of polarization indicated by the sumbol 11 emitted from a source 12 and directed at the body 1, it is reflected between the mirrors 4 and 5 to make multiple passages through the body 1 prior to exiting as a beam 20 having an altered direction of polarization as indicated by the symbol 21. The exiting beam 20 may be received in a detector means 22 which determines the amount of rotation of the direction of polarization of the beam.

The current which is to be measured is applied to a winding 13 having a core 14 which directs the magnetic field produced in the winding due to the current flow therein to create a magentic field having a flux in the direction of the arrows H. It should be realized that the flux H could be in the opposite direction and that while the embodiment illustrates a magneto-optical body having reflective surfaces to obtain multiple passages of the polarized beam 10, it is possible to utilize a body in which the beam passes in a straight path through the body. The winding 13 can also surround the magneto-optic body 1, and a core 14 may not be included.

Figure 2:
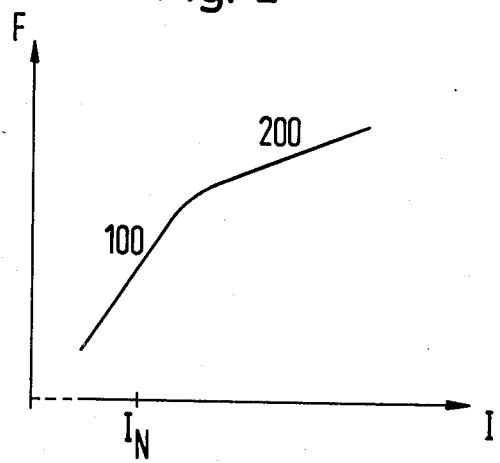
FIG. 2 is a graphic representation of the Faraday rotation (F) versus the current (I) creating the magnetic field.

FIG. 2 illustrates the relationship of the Faraday rotation (F) in response to the current strength (I) which is to be measured. The slope or gradient of the plotted curve is the differential quotient $dF/dI$. In a region of a nominal current strenth $I_N$, the curve has a linear portion 100 which has a rather steep slope and the amount of the Faraday rotation is produced mainly by the layer 2 of the body 1. In a region of an excessive current, the curve again posseses a linear portion 200 having a lower or lesser slope or gradient and the additional Faraday rotation (F) is produced only in the part 3 of the body.

In operation, a flux H produced by the current to be measured will cause rotation in a direction of polarization of the light beam which traverses the body 1.

When measuring nominal currents, rotation occurs in both the layer 2 and the plate 3, but since the layer 2 has a higher sensitivity, it will produce most of the Faraday rotation. As the intensity of the current increases, the flux produced increases and reaches the point at which the layer 2 will be saturated. At this point, any increase in current will not produce any additional Faraday rotation in the layer 2 and the amount of Faraday rotation for the saturated material of the layer 1 will remain constant. With an increased current and the resulting increase magnetic field, the plate 3 which has a lower sensitivity will continue to provide Faraday rotation of the polarized beam to produce the curve 200.

Preferably, the body 1 is constructed in such a manner that the nominal current strength will produce a magnetic field which reaches only approximately a half of the saturation field strength for the material of the layer 2. Thus, the device using the body 1 can have a high sensitivity for measuring current of the nominal value.

As mentioned above, the beam 20 whose polarization has been rotated by the Faraday rotation exerted by the body 1 is received by detecting means 22. The detecting means 22 may be a simple device utilizing a measuring transformer with a compensation Faraday rotator. If both the transducer utilized to measure the high current and the compensation transducer are constructed in the same manner, an approximately linear relationship can be produced between the high current which is to be measured and the strength of an auxiliary current. If the measuring transducer of the invention carries a high voltage potential and the known transducer which exhibits a linear relationship with a constant differential quotient between the magnetic field and Faraday rotation, carries earth potential, then a curve corresponding to that shown in FIG. 2 will be produced between the high current which is to be measured and the strength of the auxiliary current, if the auxiliary current is imagined to be plotted on the ordinate and the strength of the high current is imagined to be plotted on the abscissa. Thus, by determining the amount of rotation of the polarization of the beam 20, the amount of current applied to create the field H producing the rotation can be determined.

The measruing transducer of the present invention are particularly useful when incorporated in a protective system for high voltage applications. A known Faraday rotator, which exhibits a virtually linear dependence with approximately constant differential quotient $dF/dI$ between current strength and Faraday rotation is arranged at the high voltage near the current, which is being monitored. At an earth potential, a measuring transducer of the present invention is utilized to compensate the Faraday rotation which has occurred due to the high current. For this purpose the measuring transducer of the invention is connected to an auxiliary circuit with a variable current strength and correspondingly the rotation of the transducer of the present invention is exposed to a variable magnetic field. When the specific value of Faraday rotation increases due to an increase in the current strength in the high voltage section, the current strength in the auxiliary circuit, which strength is required for compensation, increases drastically as the first part 2 of the Faraday rotator is saturated and the compensation is achieved only by the second part 3, which has a substantially lower differential quotient $dF/dI$. A protective switch which is actuated by a drastic increase in the auxiliary current is coupled to the auxiliary circuit and will act to interrupt the high voltage or current flow in the source being monitored.

Although minor modifications might be suggested by those versed in the art, it should be understood that I wish to employ within the scope of the patent granted hereon, all such modifications as reasonably and properly come within the scope of my contribution to the art.

I claim:

1. A unitary magneto-optical measuring transducer for use as a Faraday rotator in a device for measuring high currents at high voltages, responsive to a magnetic field produced by a current which is to be measured for rotating the direction of polarization of a beam of polarized light which passes therethrough, said transducer comprising a first magnetically saturable part and a second part which has a diamagnetic or paramagnetic behavior, said first and second parts being formed as two parts of a single unitary structure and arranged to be traversed by the polarized beam of light, said second part comprising a gadolinium-gallium-garnet plate having a thickness substantially greater than the thickness of said first part.

2. A unitary magneto-optical measuring transducer for use as a Faraday rotator in a device for measuring high currents at high voltages, responsive to a magnetic field produced by a current which is to be measured rotating the direction of polarization of a beam of polarized light which passes therethrough, said transducer comprising a first magnetically saturable part and a second part which has a diamagnetic or paramagnetic behavior, said first and second parts being formed as two parts of a single unitary structure and arranged to be traversed by the polarized beam of light, said first part consisting of a layer of yttrium-iron-garnet and the second part consisting of a gadolinium-gallium-garnet plate, the thickness of said gadolinium-gallium-garnet plate being substantially greater than the thickness of said yttrium-iron-garnet layer.

3. A Faraday rotator for measuring electric current comprising means responsive to said current for producing a single magnetic field, a magneto-optical transducer disposed in said magnetic field, and means for passing a beam of polarized light through said transducer, whereby the direction of polarization of said beam is rotated in response to said magnetic field, said transducer comprising a first magnetically saturable part and a second part which has a diamagnetic or paramagnetic behavior, said first part consisting of a layer of yttrium-iron-garnet and said second part consisting of a layer of gadolinium-gallium-garnet having a thickness greater than said yttrium-iron-garnet layer.

4. A magneto-optical measuring transducer according to claim 2, wherein the thickness of said gadolinium-gallium-garnet plate is approximtely 1 mm.

5. A Faraday rotator according to claim 3, in which the thickness of said gadolinium-gallium-garnet layer is approximately 1 mm.

* * * * *